United States Patent
Coskun et al.

(10) Patent No.: US 10,935,892 B2
(45) Date of Patent: Mar. 2, 2021

(54) FREEFORM DISTORTION CORRECTION

(71) Applicant: Applied Materials, Inc., Santa Clara, CA (US)

(72) Inventors: Tamer Coskun, San Jose, CA (US); Thomas L. Laidig, Richmond, CA (US); Jang Fung Chen, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 515 days.

(21) Appl. No.: 15/595,497

(22) Filed: May 15, 2017

(65) Prior Publication Data
US 2018/0329310 A1  Nov. 15, 2018

(51) Int. Cl.
G03F 7/20 (2006.01)

(52) U.S. Cl.
CPC .. G03F 7/70633 (2013.01); *G03F 2007/2067* (2013.01)

(58) Field of Classification Search
CPC ......... G03F 7/70633; G03F 2007/2067; G03F 1/36; G03F 7/70616
See application file for complete search history.

(56) References Cited

U.S. PATENT DOCUMENTS

| | | | | |
|---|---|---|---|---|
| 5,311,600 A | * | 5/1994 | Aghajan | G06K 9/4604 382/156 |
| 6,883,158 B1 | * | 4/2005 | Sandstrom | G03F 7/704 430/5 |
| 7,508,515 B2 | | 3/2009 | Hanina et al. | |
| 2003/0059689 A1 | * | 3/2003 | Ehrmann | G03F 1/20 430/5 |
| 2003/0081193 A1 | * | 5/2003 | White | B82Y 10/00 355/72 |
| 2004/0072447 A1 | * | 4/2004 | Roberts | H01L 23/544 438/734 |
| 2005/0186692 A1 | | 8/2005 | Olsson et al. | |

(Continued)

FOREIGN PATENT DOCUMENTS

| | | |
|---|---|---|
| JP | H11-204393 A | 7/1999 |
| JP | 2000-150347 A | 5/2000 |

(Continued)

OTHER PUBLICATIONS

U.S. Appl. No. 15/412,530, filed Jan. 23, 2017, entitled Compact Eye Module Layout.

(Continued)

*Primary Examiner* — Jacob T Minskey
*Assistant Examiner* — Cedrick S Williams
(74) *Attorney, Agent, or Firm* — Patterson + Sheridan LLP

(57) ABSTRACT

Methods and systems are provided that, in some embodiments, print and process a layer. The layer can be on a wafer or on an application panel. Thereafter, locations of the features that were actually printed and processed are measured. Based upon differences between the measured differences and designed locations for those features at least one distortion model is created. Each distortion model is inverted to create a corresponding correction model. When there are multiple sections, a distortion model and a correction model can be created for each section. Multiple correction models can be combined to create a global correction model.

20 Claims, 18 Drawing Sheets

(56) References Cited

U.S. PATENT DOCUMENTS

| | | | |
|---|---|---|---|
| 2007/0021860 A1* | 1/2007 | Gertrudus Simons | ........................ G03F 7/70516 700/121 |
| 2007/0220920 A1* | 9/2007 | Allaire | .................... C03B 15/02 65/29.12 |
| 2008/0073589 A1* | 3/2008 | Adel | ................... G03F 7/70458 250/492.22 |
| 2012/0045852 A1 | 2/2012 | Baccini et al. | |
| 2016/0238951 A1 | 8/2016 | White | |
| 2020/0103762 A1* | 4/2020 | Den Boef | .............. G01B 11/27 |

FOREIGN PATENT DOCUMENTS

| | | |
|---|---|---|
| JP | 2012-004564 A | 1/2012 |
| WO | 2006/073155 A1 | 7/2006 |
| WO | 2007026174 A2 | 3/2007 |
| WO | 2015195272 A1 | 12/2015 |

OTHER PUBLICATIONS

International Search Report and Written Opinion issued in corresponding International Application No. PCT/US2018/032521 dated Sep. 4, 2018. (14 pages).

Japanese Office Action in related matter JP2019-562598 dated Dec. 1, 2020.

Korean Office Action in related application KR 10-2019-7036823 dated Oct. 30, 2020.

\* cited by examiner

FREEFORM DISTORTION CORRECTION

BACKGROUND

Field of the Disclosure

Embodiments herein generally relate to lithography and more specifically to reducing distortion errors in the lithography of application panels and wafers.

Description of the Related Art

Photolithography is widely used in the manufacturing of semiconductor devices and display devices, such as liquid crystal display (LCDs). However, during processing, wafers and application panels can get distorted. The distortion can come from different process steps. The magnitude and shape of the distortion may vary from layer to layer. Errors in one layer may add to distortion in subsequent layers. In addition, heat due to the environment or on the glass may cause stress related distortion.

Thus there is a need to reduce distortion errors during the lithography process.

SUMMARY

Embodiments of the present disclosure generally relate to lithography and more specifically to reducing distortion errors in the lithography of application panels and wafers. In an embodiment, a method is provided that prints and processes a current layer. The current layer can be on a wafer or on an application panel. Thereafter, the locations of the features that were actually printed and processed are measured. Based upon differences between the measured differences and designed locations for those features at least one distortion model is created. Each distortion model is inverted to create a corresponding correction model. When there are multiple sections, a distortion model and a correction model can be created for each section. Multiple correction models can be combined to create a global correction model.

In another embodiment, a method is provided that measures pattern placement error. The system prints and processes a first layer. The first layer can be on a wafer or on an application panel. Thereafter, a second layer is aligned with the first layer. The alignment is to compensate for plate shift and rotation. Measurements are taken to measure the separation (i.e., the difference between feature locations) between the two layers. The first layer and the corrected second layer (using the previous separation measurements) are printed on either a new wafer or a new application panel. A third layer can be aligned with the second layer (again to account for plate shift and rotation), printed and processed on top of the second layer. Separation measurements are then taken between the second layer and the third layer. Printing and processing of the first layer, corrected second layer and corrected third layer occurs on yet another wafer or application panel.

In an embodiment, there is at least one intermediate layer between the first layer and the second layer. In this embodiment, alignment of the second layer is with the first layer. After printing and processing of the second layer, separation measurements are taken between the first layer and the second layer. The first layer may be used as a reference for all subsequent layers without reprinting and processing corrected layers on another wafer or application panel. For example, after acquiring separation measurements between the first layer and the second layer, a subsequent layer can be aligned with the first layer and printed and processed on top of the second layer.

BRIEF DESCRIPTION OF THE DRAWINGS

So that the manner in which the above recited features of the present disclosure can be understood in detail, a more particular description of the material, briefly summarized above, may be had by reference to embodiments, some of which are illustrated in the appended drawings. It is to be noted, however, that the appended drawings illustrate only typical embodiments and are therefore not to be considered limiting of its scope, for this material may admit to other equally effective embodiments.

To facilitate understanding, identical reference numerals have been used, wherever possible, to designate identical elements that are common to the figures.

DETAILED DESCRIPTION

Figure 1:
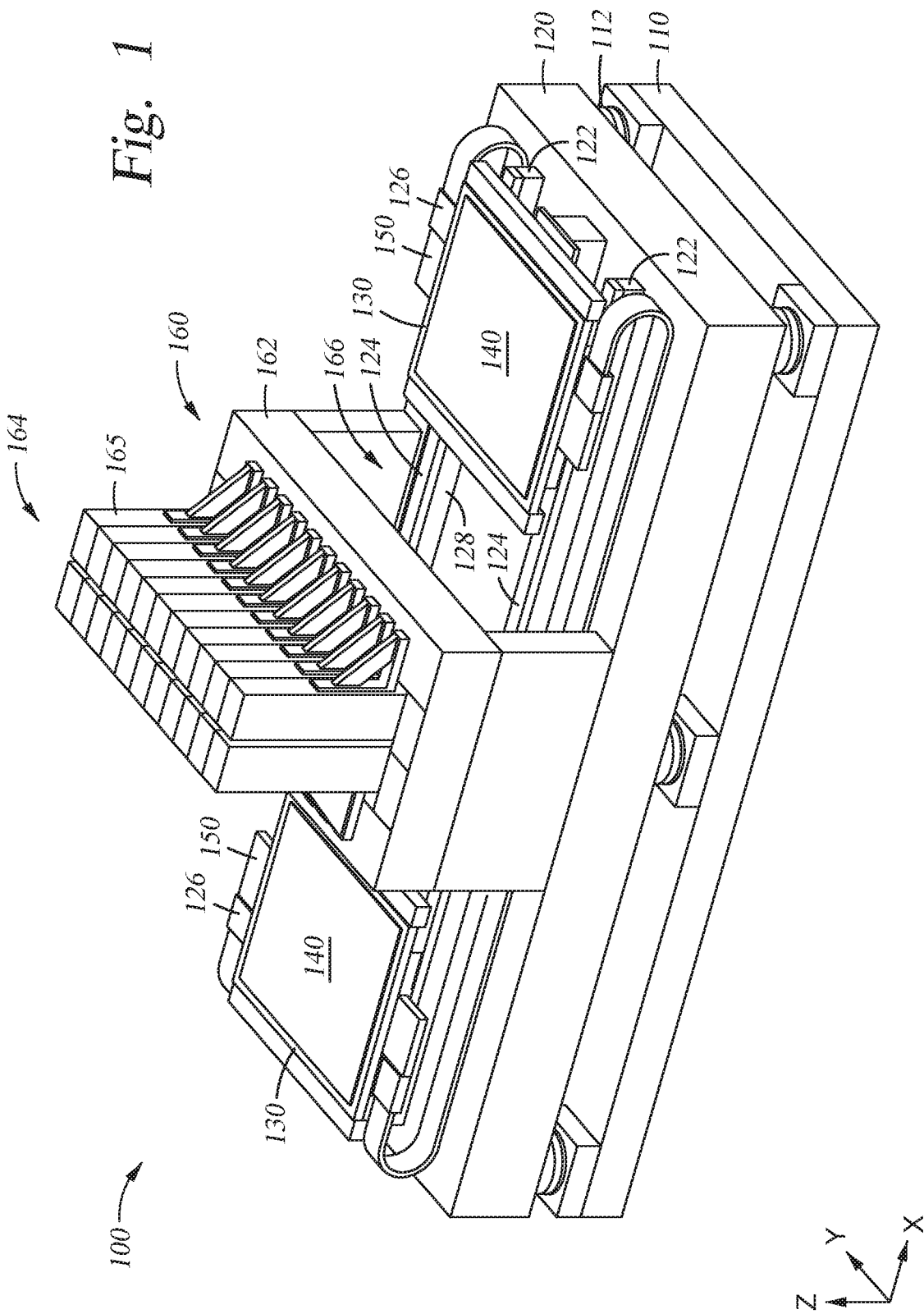
FIG. 1 is a perspective view of a system that may benefit from embodiments disclosed herein.

In the following description, numerous specific details are set forth to provide a more thorough understanding of this disclosure. As will be apparent to those skilled in the art, however, various changes using different configurations may be made without departing from the scope of this material. In other instances, well-known features have not been described in order to avoid obscuring this material. Thus, this disclosure is not considered limited to the particular illustrative embodiments shown in the specification and all such alternate embodiments are intended to be included in the scope of the appended claims.

Application panels and wafers are described interchangeably in this document. Embodiments disclosed herein utilize freeform distortion correction to correct various distortions including, but not limited to, linear distortion, non-linear distortion and pattern placement errors. The freeform distortion corrections disclosed herein can also be applied to compensate for deficiencies in modalities that only correct linear distortions. "Freeform" is defined herein as irregular and not requiring any particular pattern or form.

In short, embodiments described herein generally relate to obtaining differences between actual printed feature locations of multiple points in a layer and corresponding designed feature locations. The differences represent one form of distortion that can be used to determine which correction models are best suited to reduce the distortion(s). In some embodiments, an inverse of each difference is applied as a correction to each of the measured points.

After appropriate distortion corrections are selected, light is reflected to digital micro-mirror devices ("DMDs") (not shown). Each of the DMDs includes a plurality of mirrors (not shown) that may be controlled individually. Each mirror in the plurality of mirrors may be in an "ON" position or an "OFF" position based on the mask data and distortion corrections provided herein. When the light reaches the mirrors, the mirrors that are in the "ON" position reflect a plurality of write beams to a projection lens (not shown). The projection lens then projects the write beams to the substrate 140. The mirrors that are in the "OFF" position reflect light to a light dump (not shown) instead of the substrate 140. Applying the distortion correction solutions disclosed herein alters, in some instances, which mirrors are "ON" and "OFF" to correspond with corrected positions, layer-by-layer, on the wafer/application panel.

In other embodiments, panels/wafers can be divided into sections. At least one point in each section can be analyzed to determine the best correction model for each section. A correction model applied to one section does not have to be the same as a correction model applied to another section. Increasing the number of points analyzed may also increase the accuracy of the distortion correction.

In some embodiments, the correction models can dynamically adapt to process changes based on measurement feedback or model based variations. For example, one variation can be a correction of temperature dependent expansions where a model, as a function of temperature, can be used to determine the distortion and compensate for the distortion.

FIG. 1 is a perspective view of a system 100 that may benefit from embodiments disclosed herein. The system 100 includes a base frame 110, a slab 120, two or more stages 130, and a processing apparatus 160. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. The substrate 140 may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from one or more transfer robots (not shown). The one or more transfer robots may be used to load and unload a substrate 140 from the two or more stages 130.

The substrate 140 may, for example, be made of quartz and be used as part of a flat panel display. In other embodiments, the substrate 140 may be made of other materials. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or a negative photoresist. For example, the photoresist may include at least one of diazonaphthoquinone, a phenol formaldehyde resin, poly (methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120. The slab 120 and the pair of supports 122 may be a single piece of material. The pair of tracks 124 may be supported by the pair of the supports 122. The two or more stages 130 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each stage 130 in order to provide location information to a controller (not shown).

The processing apparatus 160 may include a support 162 and a processing unit 164. The support 162 may be disposed on the slab 120 and may include an opening 166 for the two or more stages 130 to pass under the processing unit 164. The processing unit 164 may be supported by the support 162. In one embodiment, the processing unit 164 is a pattern generator configured to expose a photoresist in a photolithography process.

In some embodiments, the pattern generator may be configured to perform a maskless lithography process. The processing unit 164 may include a plurality of image projection apparatuses (not shown). In one embodiment, the processing unit 164 may contain 84 image projection apparatuses. Each image projection apparatus is disposed in a case 165. The processing apparatus 160 may be utilized to perform maskless direct patterning.

During operation, one of the two or more stages 130 moves in the X-direction from a loading position, as shown in FIG. 1, to a processing position. The processing position may refer to one or more positions of the stage 130 as the stage 130 passes under the processing unit 164. During operation, the two or more stages 130 may be lifted by a plurality of air bearings (not shown) and may move along the pair of tracks 124 from the loading position to the processing position. A plurality of vertical guide air bearings (not shown) may be coupled to each stage 130 and positioned adjacent an inner wall 128 of each support 122 in order to stabilize the movement of the stage 130. Each of the two or more stages 130 may also move in the Y-direction by moving along a track 150 for processing and/or indexing the substrate 140. Each of the two or more stages 130 is capable of independent operation and can scan a substrate 140 in one direction and step in the other direction. In some embodiments, when one of the two or more stages 130 is scanning a substrate 140, another of the two or more stages 130 is unloading an exposed substrate and loading the next substrate to be exposed.

A metrology system measures the X and Y lateral position coordinates of each of the two or more stages 130 in real time so that each of the plurality of image projection apparatuses can accurately locate the patterns being written in a photoresist covered substrate. The metrology system also provides a real-time measurement of the angular position of each of the two or more stages 130 about the vertical or Z-axis. The angular position measurement can be used to hold the angular position constant during scanning by means of a servo mechanism or it can be used to apply corrections to the positions of the patterns being written on the substrate 140.

Figure 2:
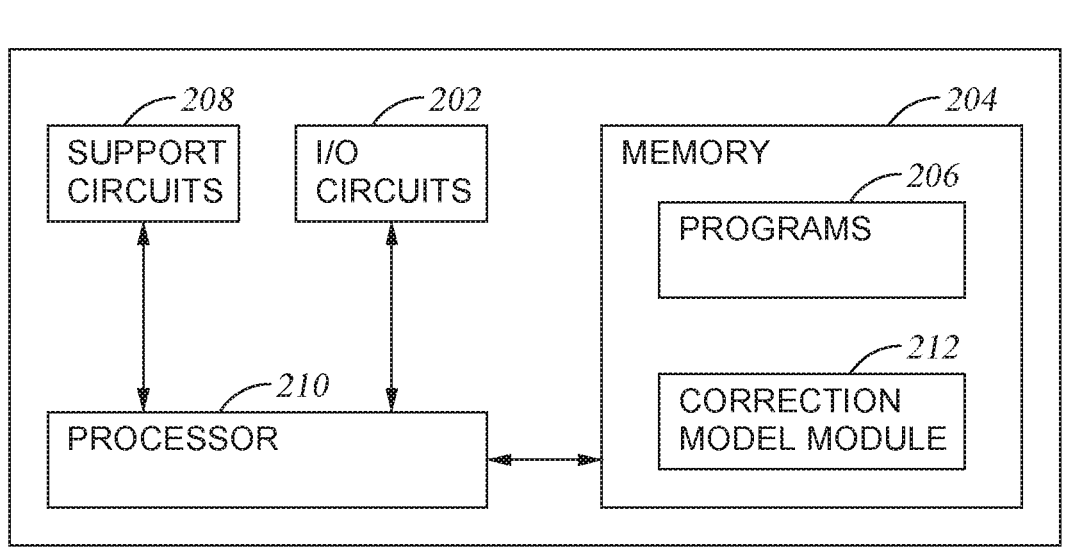
FIG. 2 depicts an embodiment of a high-level block diagram of a processing unit for providing distortion correction in accordance with material disclosed herein.

FIG. 2 depicts an embodiment of a high-level block diagram of a processing unit 164 for creating distortion models, distortion correction models and correction of pattern placement errors in accordance with embodiments disclosed herein. For example, the processing unit 164 is suitable for use in performing the methods of FIGS. 5, 8 and 11B. The processing unit 164 in FIG. 2 includes a processor 210 as well as a memory 204 for storing control programs and the like.

In various embodiments, memory 204 also includes programs (e.g., depicted as "correction model module" 212) for creating a distortion model(s), creating a correction model(s) and correcting pattern placement errors by performing the embodiments described herein. Memory 204 includes programs (not shown) for mask designs. In an embodiment, files regarding mask design are stored in graphic data system files (e.g., "GDS"). However, the files can be any format which provides graphic data. When instructed these programs determine which mirrors transmit unused light to a light dump and which mirrors illuminate the substrate based upon the correction model(s).

The processor 210 cooperates with conventional support circuitry 208 such as power supplies, clock circuits, cache memory and the like as well as circuits that assist in executing the software routines 206 stored in the memory 204. As such, it is contemplated that some of the process steps discussed herein as software processes can be loaded from a storage device (e.g., an optical drive, floppy drive, disk drive, etc.) and implemented within the memory 204 and operated by the processor 210. Thus, various steps and methods of the present material can be stored on a computer readable medium. The processing unit 164 also contains input-output circuitry 202 that forms an interface between the various functional elements communicating with the processing unit 164.

Although FIG. 2 depicts a processing unit 164 that is programmed to perform various control functions in accordance with the present disclosure, the term computer is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein. In addition, although one general-purpose computer 1000 is depicted, that depiction is for brevity on. It is appreciated that each of the methods described herein can be utilized in separate computers.

In general, distortion can be modelled as a variation of $(\Delta x, \Delta y)$ from the original design (x,y) as a function of the location on the substrate/glass. This can be expressed in Eq. (1) and (2) as:

$$\Delta y(x,y) = f(x,y) \qquad \text{Eq. (1)}$$

$$\Delta y(x,y) = g(x,y) \qquad \text{Eq. (2)}$$

where f(x,y) represents the amount of distortion in x as a function of position; and g(x,y) represents the amount of distortion in y as a function of position. The f and g functions may take a polynomial form where the polynomial coefficients can be calibrated based upon the measurement data.

Figure 3A:
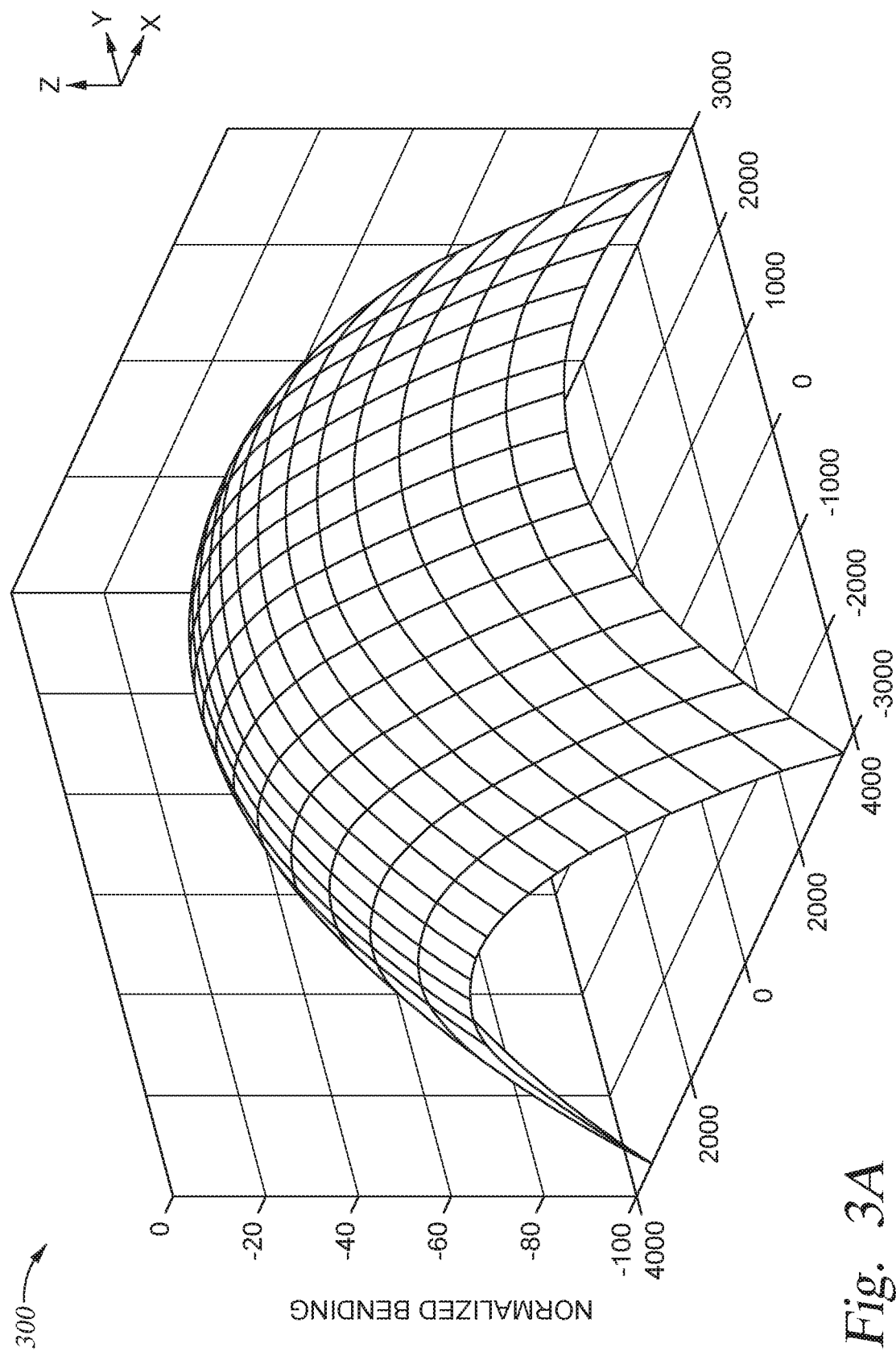
FIG. 3A depicts a 3-Dimentional view of an example of deformation to a substrate.
Figure 3B:
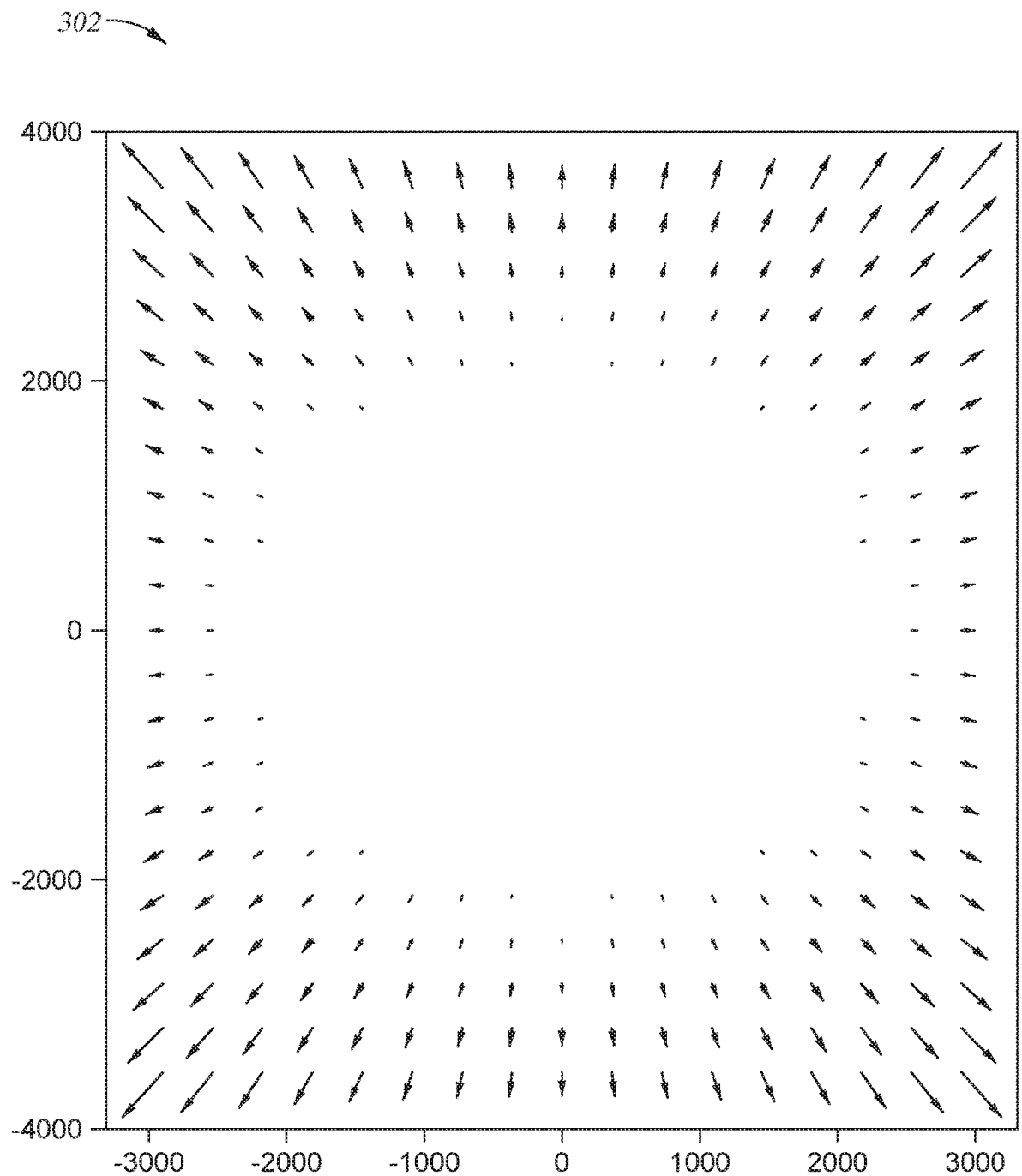
FIG. 3B depicts a vector representation of the deformation depicted in FIG. 3A.

FIG. 3A depicts a 3-Dimentional view of an example of deformation 300 to a substrate. For example, when multiple layers are processed on a substrate, the layers can get distorted and form a "hump" as shown at 300. The units of measure at the "X" and "Y" coordinates are in microns. There is no unit of measure for the "Z" axis. In the view 300, the center is almost zero while the corners and the edges are where the greatest distortion occurs. FIG. 3B depicts a vector representation 302 of the deformation 300 depicted in FIG. 3A.

Figure 4A:
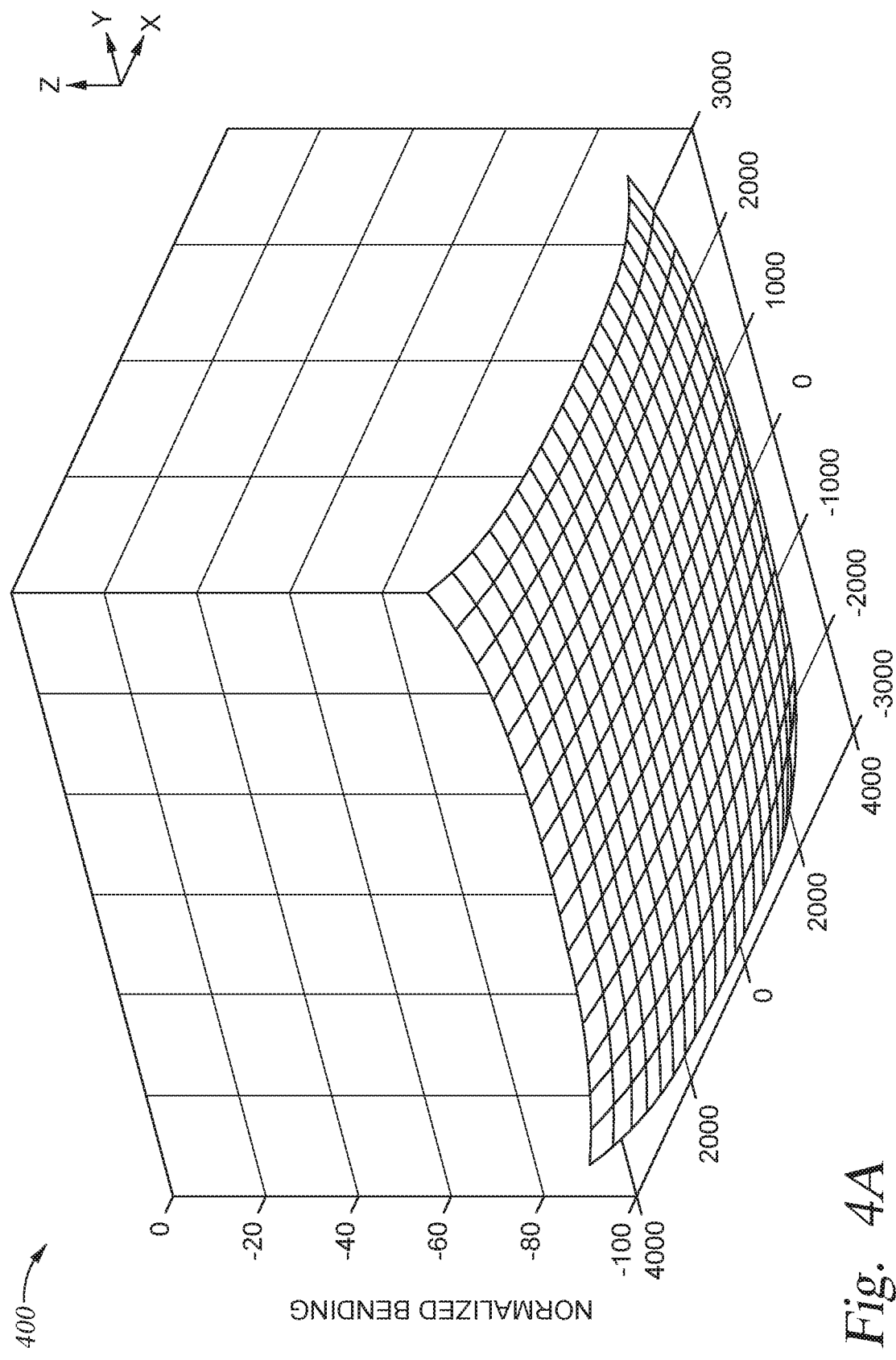
FIG. 4A depicts a 3-Dimentional view of another example of deformation to a substrate.
Figure 4B:
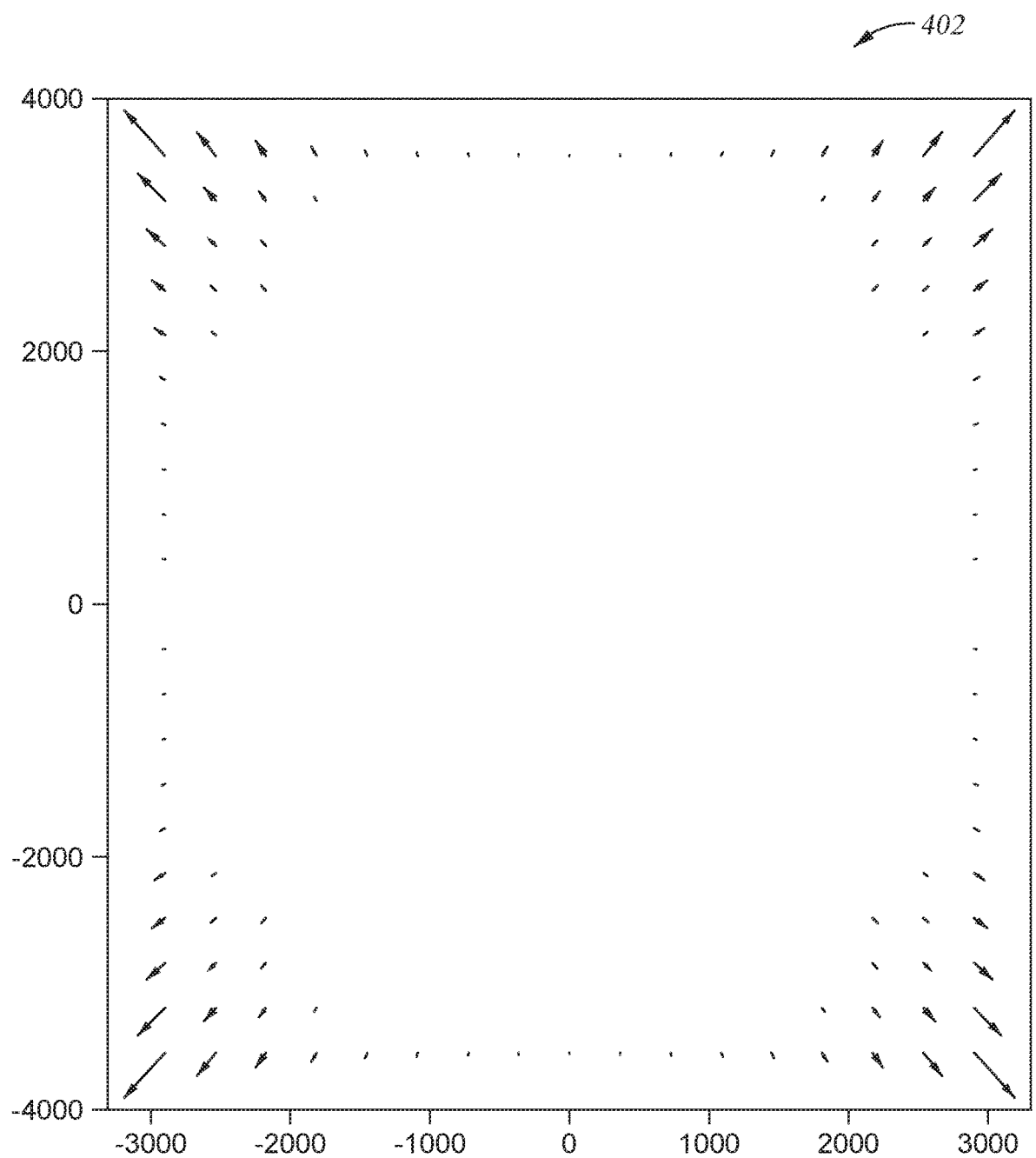
FIG. 4B depicts a vector representation of the deformation depicted in FIG. 4A.

FIG. 4A depicts a 3-Dimentional view of another example of deformation 400 to a substrate. For example, when a substrate is placed on top of a "chuck," vacuum pressure is exerted on the substrate to flatten the substrate and reduce distortion. However, there can still be distortion near the edges and corners because the suction may not be as great near the edges and corners. Depending upon the configuration of the vacuum the distortion can have a different shape than the distortion depicted in FIG. 4. FIG. 4B depicts a vector representation 402 of the deformation 400 depicted in FIG. 4A.

Figure 5:
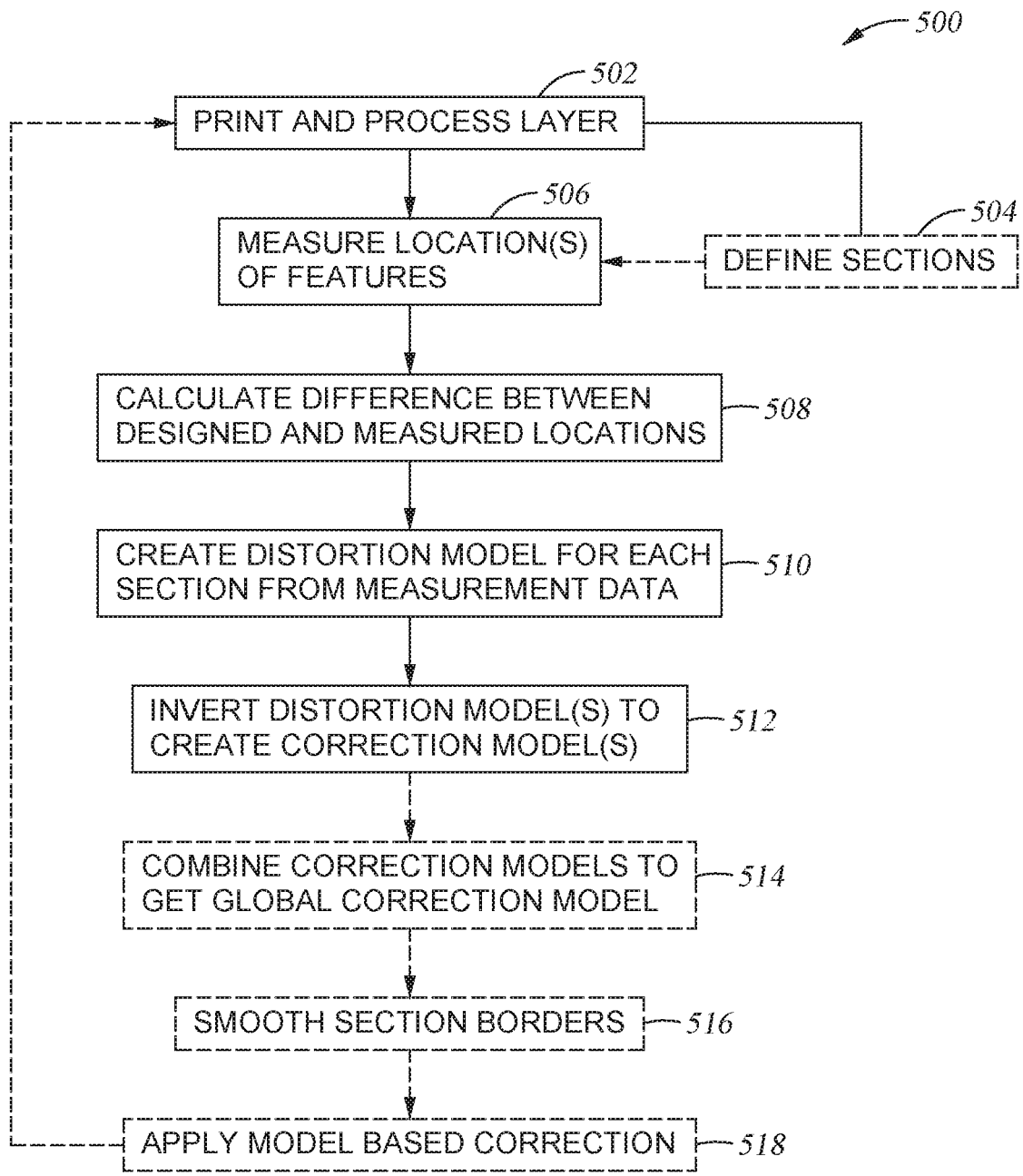
FIG. 5 depicts a method for correcting distortion in accordance with embodiments disclosed herein.

FIG. 5 depicts a method 500 for correcting distortion in accordance with embodiments disclosed herein. The method 500 begins when a layer is printed and processed on a wafer or application panel. "Printing and processing" as used in this document includes typical steps such as for example, depositing, cleaning, developing, etching, and exposing. As such, printing and processing will not be described in greater detail. Printing and processing at block 502 can be for any layer.

After block 502, the method 500 proceeds towards block 506. At block 506, location points of features are measured on the substrate to obtain the actual locations of those features. The measurements are transmitted towards the processing unit 164. In an embodiment, the measurements are in the form of Cartesian coordinates. In another embodiment, the measurements are in the form of vectors. In yet another embodiment, the measurements are in the form of a distance and angle from a reference point.

At block 508, differences are calculated between the measurements acquired at block 506 and designed feature locations stored in memory 206. In an embodiment, the calculated differences can be used to update the design measurements when desired.

Figure 6:
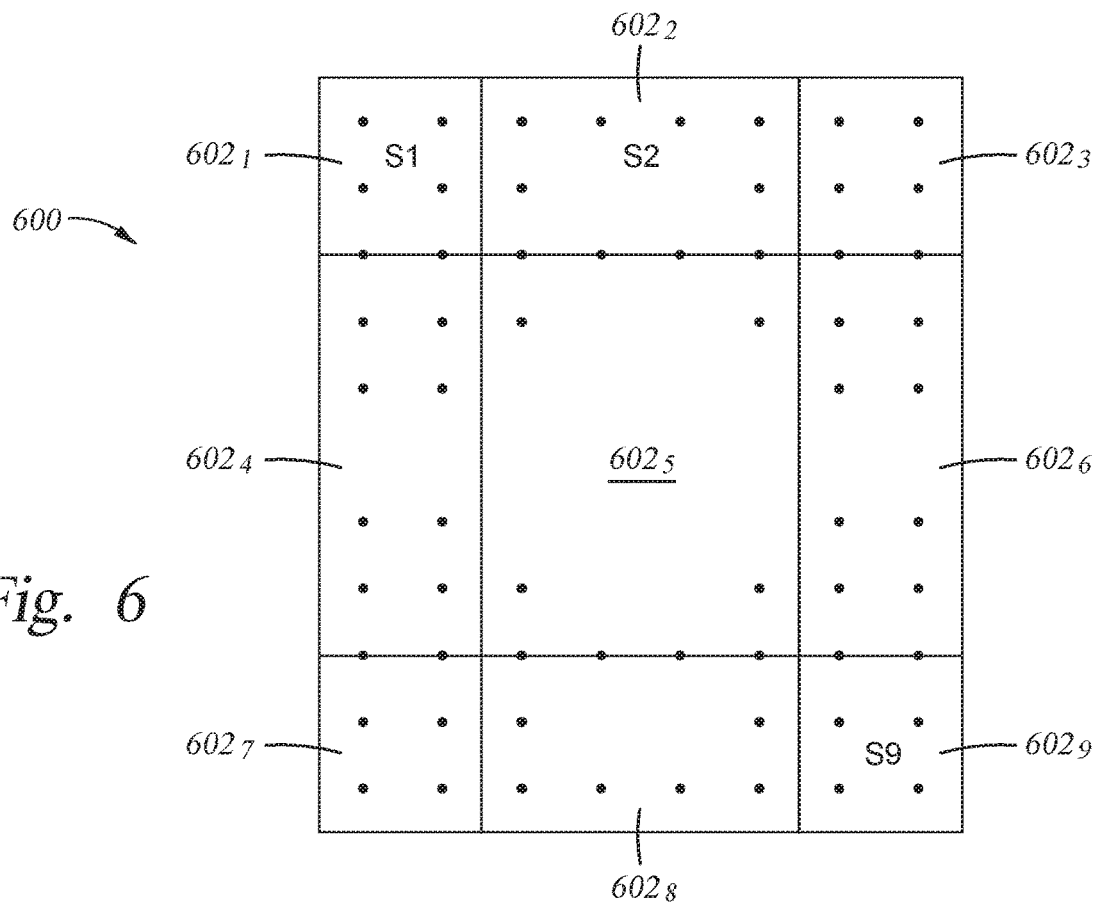
FIG. 6 depicts an embodiment of a substrate divided into sections in accordance with embodiments disclosed herein.

In an embodiment, one form of correction can be applied in a discrete fashion by splitting the entire design into small cells/sections and calculating a correction amount ($\Delta x_{corr}$, $\Delta y_{corr}$) based on the center of that section and moving the pixelated design within that section accordingly. Method 500 can also include an optional block 504 that divides a substrate into sections. Block 504 can occur at any time before block 510. Illustratively, block 504 is depicted as occurring prior to block 506. FIG. 6 depicts an embodiment of a substrate 600 divided into sections. For illustrate purposes only, the substrate 600 is divided into nine sections $602_1$, $602_2$, $602_3$, $602_4$, $602_5$, $602_6$, $602_7$, $602_8$, and $602_9$ (collectively "sections 602"). Each of the sections also includes a plurality of feature location points that can be measured. For example, section $602_4$ includes eight feature location points.

"Smoothing" of section borders can also be performed to reduce the likelihood of discontinuity in the mask features from one section to another. For example if there is a line that needs to go through the section borders you may have a discontinuity in that line. In an embodiment, a low-pass filter (e.g., a Gaussian Filter) is applied to the correction at the section borders and edges to smooth discontinuities.

When the substrate is divided into sections, feature location points can be measured for each section and a separate distortion model can be created for each section. Not all feature location points in any given section have to be measured. As the number of feature location points measured in any section increases the accuracy of the mapping of the distortion in that section may also increase. When optional block 504 is not performed, the substrate can be analyzed as one section.

Returning to FIG. 5, a distortion model(s) is created, at block 510, based upon the differences (i.e., the type of distortion) between the actual printed feature locations and the designed feature locations. For example, in an embodiment, if "pincushion distortion" is associated with a particular mask or section in a mask then a distortion model associated with pincushion distortion may be applied. Various equations can be used to create distortion models. In an embodiment, one form of correction can be applied to design polygons by moving each polygon point (x,y) to a new location $(\hat{x},\hat{y})$ defined by:

$$(\hat{x},\hat{y}) = (x - f(x,y), y - g(x,y)) \quad \text{Eq. (3)}$$

where $(\hat{x},\hat{y})$ is the new location; x and y represent the design location; f(x,y) represents the amount of distortion in x as a function of position; and g(x,y) represents the amount of distortion in y as a function of position.

Although various equations are described herein those equations other equations may be used to correct for linear distortion. Some equation can be in the form of a polynomial equation. For example, $$\Delta x(x, y) = \begin{Bmatrix} \sum_{l=0}^{M_1} p_{1,xl} P_l(x, y), (x, y) \subset s1 \\ \sum_{l=0}^{M_2} p_{2,xl} P_l(x, y), (x, y) \subset s2 \\ \vdots \\ \sum_{l=0}^{M_N} p_{N,xl} P_l(x, y), (x, y) \subset sN \end{Bmatrix} \quad \text{Eq. (4)}$$

where $\Delta x$ is the distortion in x for a given (x,y) position; sN represents the section that includes the location feature/point; $M_1, M_2, \ldots, M_N$ represents the number of polynomial terms for each section; N represents the number of sections; Pl(x,y) are polynomial terms provided by Eq. (6), (7), (8), (9), (10), and (11) below; and p1,x0; p1,x1 are coefficients for $P_0, P_1$ etc. obtained by fitting measurements:

$$\Delta y(x, y) = \begin{Bmatrix} \sum_{l=0}^{M_1} p_{1,yl} P_l(x, y), (x, y) \subset s1 \\ \sum_{l=0}^{M_2} p_{2,yl} P_l(x, y), (x, y) \subset s2 \\ \vdots \\ \sum_{l=0}^{M_N} p_{N,yl} P_l(x, y), (x, y) \subset sN \end{Bmatrix} \quad \text{Eq. (5)}$$

where $\Delta y$ is the distortion in y for a given (x,y) position; sN represents the section that includes the location feature/point; $M_1, M_2, \ldots, M_N$ represents the number of polynomial terms for each section; N represents the number of sections; Pl(x,y) are polynomial terms provided by Eq. (6), (7), (8), (9), (10), and (11) below; and p1,x0; p1,x1 are coefficients for $P_0, P_1$, etc. obtained by fitting measurements:

$$P_0(x,y) = 1 \quad \text{Eq. (6)}$$

$$P_1(x,y) = x \quad \text{Eq. (7)}$$

$$P_2(x,y) = y \quad \text{Eq. (8)}$$

$$P_3(x,y) = x^2 \quad \text{Eq. (9)}$$

$$P_4(x,y) = y^2 \quad \text{Eq. (10)}$$

$$P_5(x,y) = xy \quad \text{Eq. (11)}$$

In an embodiment, when there are multiple distortion models the distortion models can be combined to create one distortion model, as shown by Eq. (4) and (5). However, in another embodiment each distortion model is inverted and the correction models are combined to create one correction model. In another embodiment, correction model is based upon an average of the distortion based upon multiple processes. For example, distortion measurements can be taken for multiple samples in case there is a variation in the distortion measurements from sample to sample. The average distortion of those samples can be used to create a correction model.

In another embodiment, the method 500 repetitively performs blocks 502, 506, 508, and 510 until a penultimate layer is printed and processed. Thereafter, a last layer using at least one correction model is created from actual feature locations on the penultimate layer and design feature locations for the penultimate layer.

Figure 7:
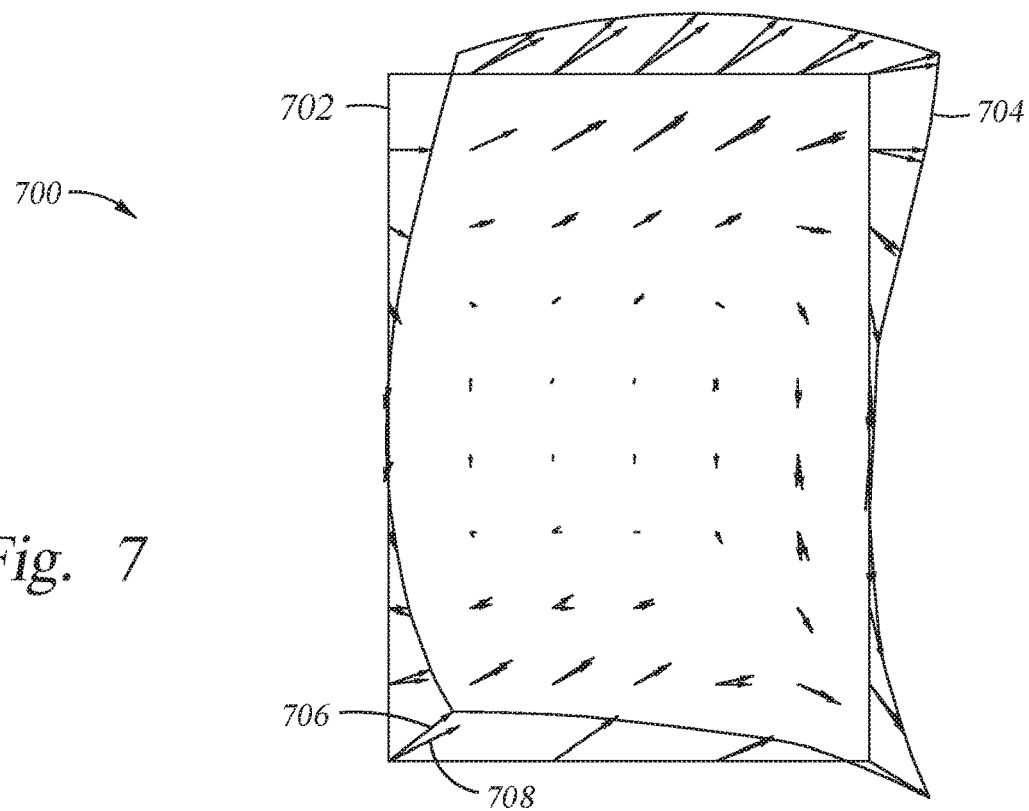
FIG. 7 depicts a vector representation of an example distortion of a substrate.

FIG. 7 depicts a vector representation 700 of an example distortion 704 for a substrate 702. Vectors 708 represent the magnitude and direction of the example distortion 704 at each measurement point. Each vector 706 represents an inverse of the distortion at each measurement point that can be used to correct the distortion at that measurement point.

Figure 8:
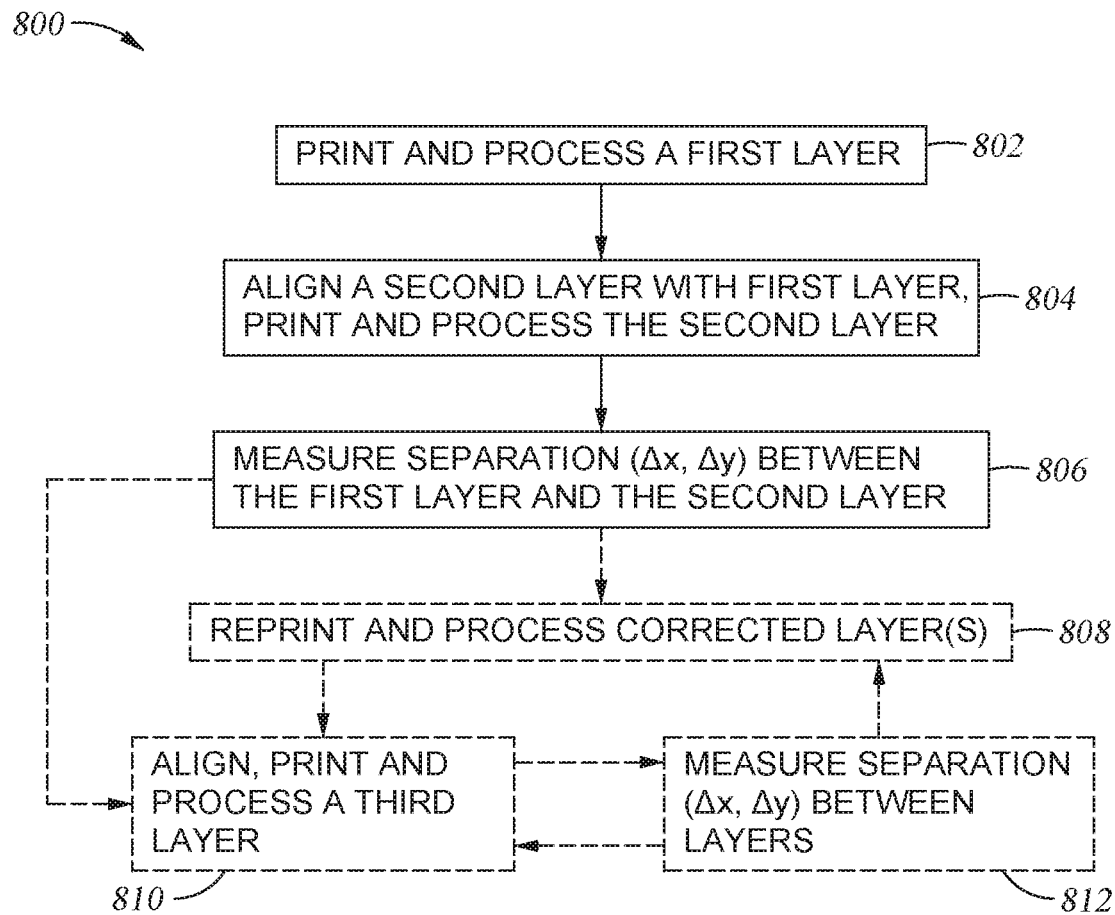
FIG. 8 depicts a method of correcting distortion due to pattern placement error in accordance with embodiments disclosed herein.

FIG. 8 depicts a method 800 of correcting distortion due to pattern placement errors in accordance with embodiments disclosed herein. The method 800 begins at block 802 by printing and processing a first layer. At block 804, "another" layer, such as a second layer, is aligned with the first layer. "Aligning" as used in the method 800 refers to aligning for plate shift and rotation. After alignment the second layer is printed and processed. At block 806, separation (i.e., ($\Delta x$, $\Delta y$)) is measured between the first layer and the second layer. "Separation" as used herein is the difference between printed locations of features of one layer and the printed locations of features in another layer. The measured separation can be stored in memory 204 for later use.

Other embodiments of method 800 include several optional blocks. For example, in an embodiment, after block 806 the method 800 proceeds towards optional block 808.

At block 808, the measurements acquired at block 806 are used, on a different substrate, to reprint the first layer and to reprint the corrected second layer. The second layer has been reprinted so that it is aligned with the first layer using an inverse of the separation measurements that were acquired in block 806. Thereafter the method 800 proceeds towards optional block 810. At block 810, a subsequent layer, such as a third layer, is aligned, printed and processed on top of the first layer and the corrected second layer. At optional block 812, separation ($\Delta x, \Delta y$) is measured between the second layer and the third layer. The measured separation can be stored in memory and an inverse of the measured separation can be used to reprint and process a corrected third layer. After block 812, the method 800 process towards block 808 where, on another substrate, the first layer, the corrected second layer and the corrected third layer are printed and processed. Thereafter, the method 800 proceeds towards blocks 810 and 812 as described above. In this embodiment, optional blocks 808, 810 and 812 form an iterative loop that operates until the desired layers are printed, aligned, processed, and measured.

In another embodiment, the first layer may act as a reference for each subsequent layer. For example, in an embodiment of method 800, at block 810 a third layer has been aligned with the first layer and printed on top of the second layer. The second layer is an intermediary layer between the first layer and the third layer. Because the first layer is used as reference layer there is no need to print the first layer and the second layer on a separate substrate prior to printing the third layer. Each layer can be aligned with the first layer, printed and processed on the same substrate. After block 810, the method 800 proceeds towards optional block 812. At block 812, the separation between the first layer and the third layer is measured and stored in memory 204 for later use. The separation between the first layer and each subsequent layer is measured and stored in memory 204 for later use. Blocks 810 and 812 operate as an iterative loop until the desired layers are printed, aligned, processed, and measured.

Figure 9:
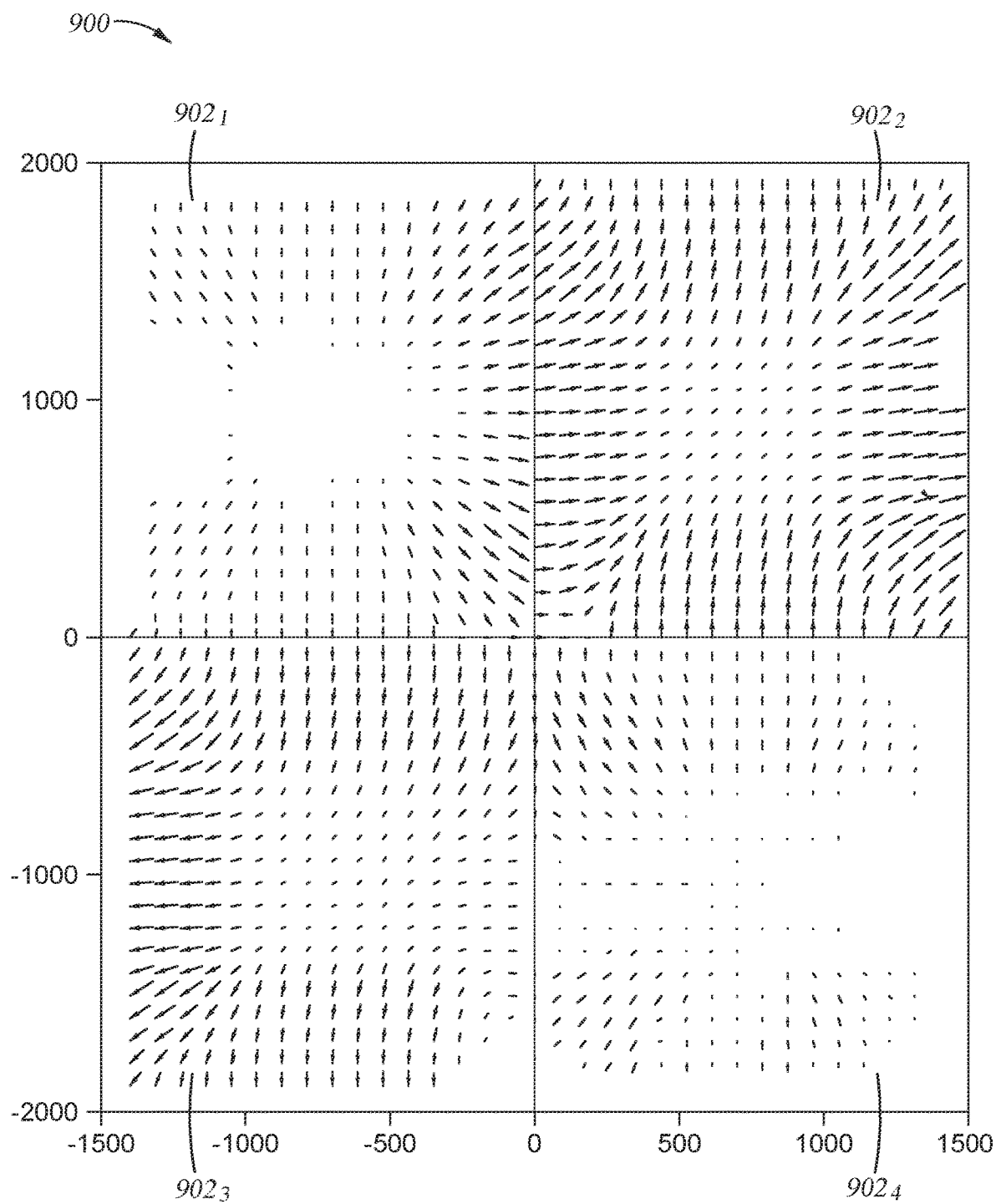
FIG. 9 depicts an example of a substrate divided into sections and includes vector representations of distortion in each of the sections.

FIG. 9 depicts a substrate 900 divided into sections ($902_1$, $902_2$, $902_3$, and $902_4$ (collectively "sections 902") and including vector representations of distortion in each of the sections. Each of the sections 902 includes distortion in a different region of the section.

Figure 10:
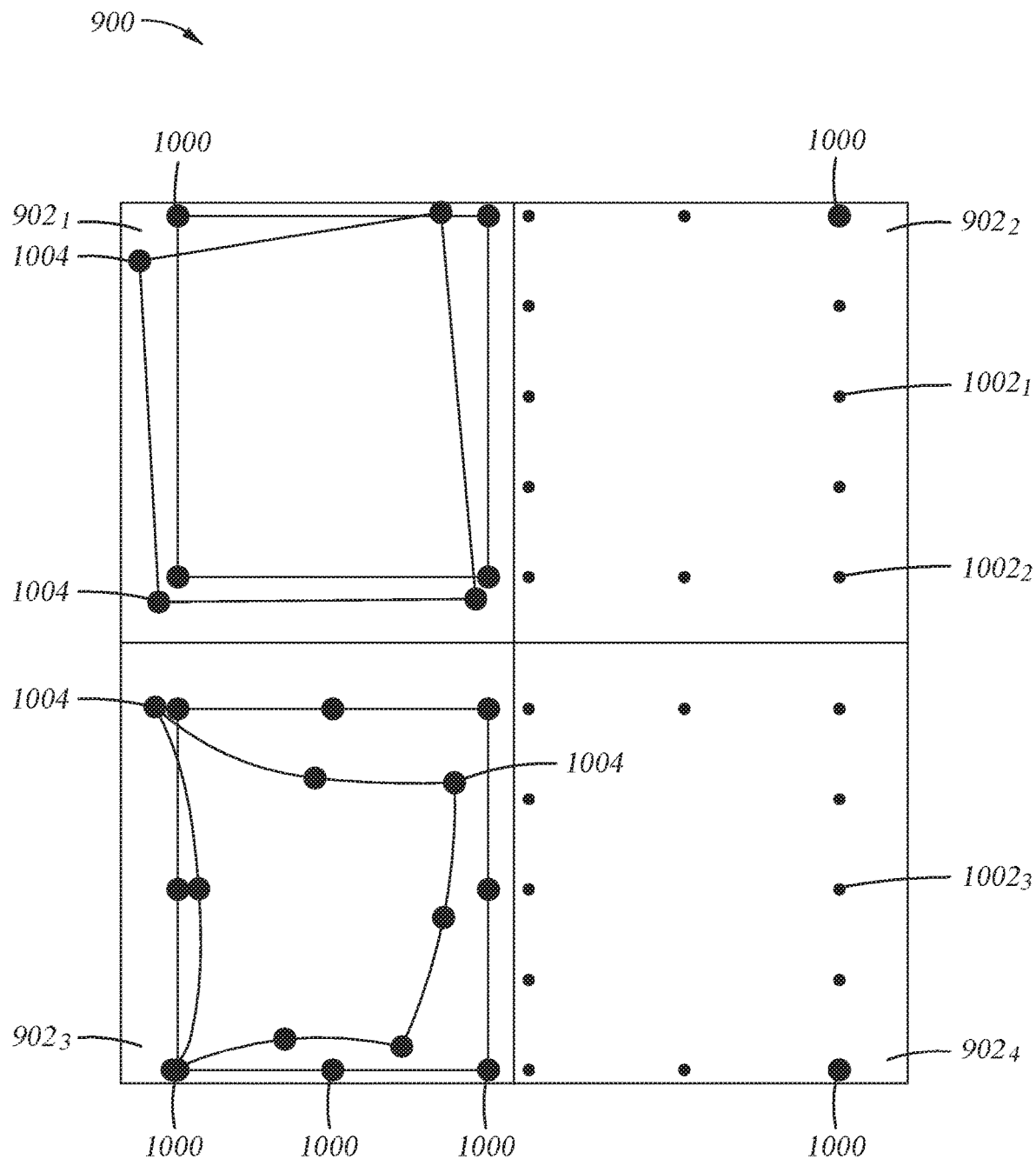
FIG. 10 depicts the substrate depicted in FIG. 9 including feature location measurement points.

FIG. 10 depicts the substrate 900 including a plurality of design feature measurement sites (e.g., design feature measurement sites $1002_1$, $1002_2$ and $1002_3$ (collectively "design feature measurement sites 1002"). Any or all of the design feature measurement sites 1002 in any section 902 can be used for measuring distortion in the section having the design feature measurement site 1002. For example, in each of sections $902_2$ and $902_4$ only one measurement point 1000 has been selected. In section $902_1$ measurements are taken from four selected measurement points 1000 for analysis with corresponding actual feature points 1004 to apply distortion correction (e.g., a nonlinear scaling correction). Generally, increasing the number of measurements in a section 1000 allows a higher order of correction. For example, in section $902_3$, eight measurement points 1000 are selected for applying a higher order distortion correction than the order of distortion correction provided to the other sections.

Figure 11A:
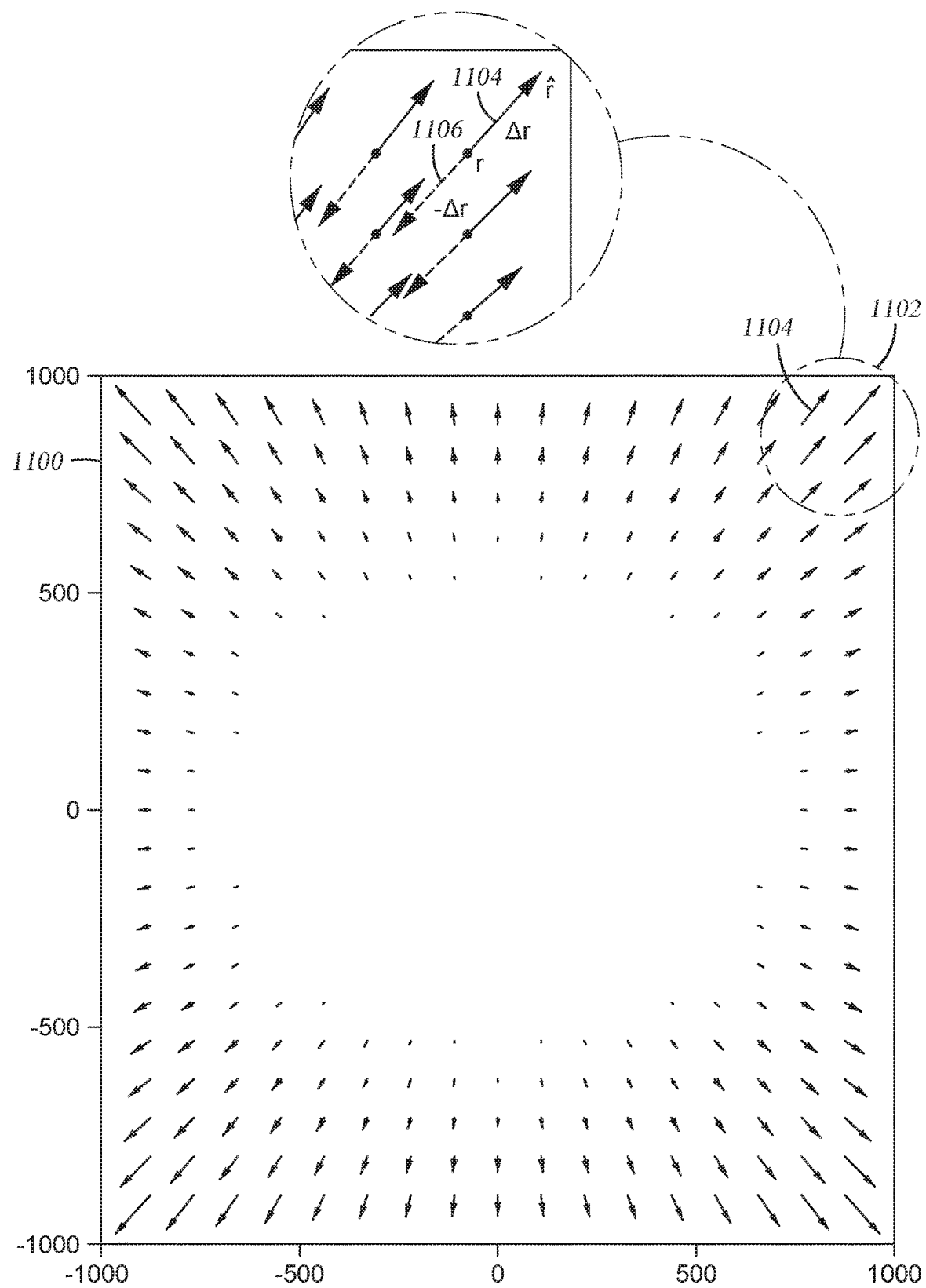
FIG. 11A depicts a vector representation of an example of another type of distortion that can be corrected in accordance with embodiments disclosed herein.

FIG. 11A depicts a vector representation of another type of distortion 1100. FIG. 11A also includes a section 1102 having a distortion 1104 of about 100 microns. In one embodiment, the distortion 1104 can be corrected by directly applying a non-linear correction 1106.

Figure 12:
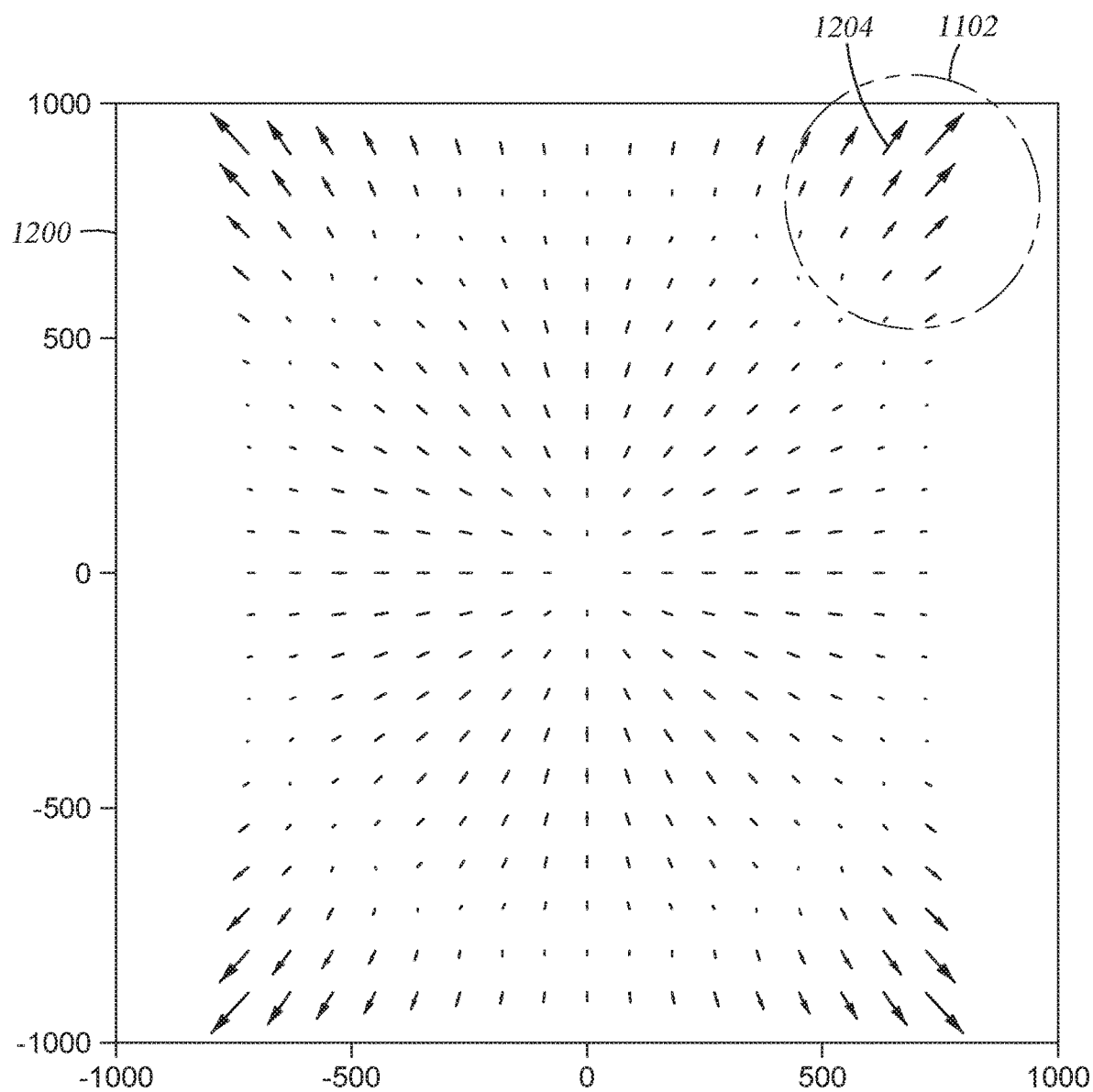
FIG. 12 depicts a vector representation of a reduction in distortion after correction for linear distortion has been applied to the distortion shown in FIG. 11A.
Figure 13:
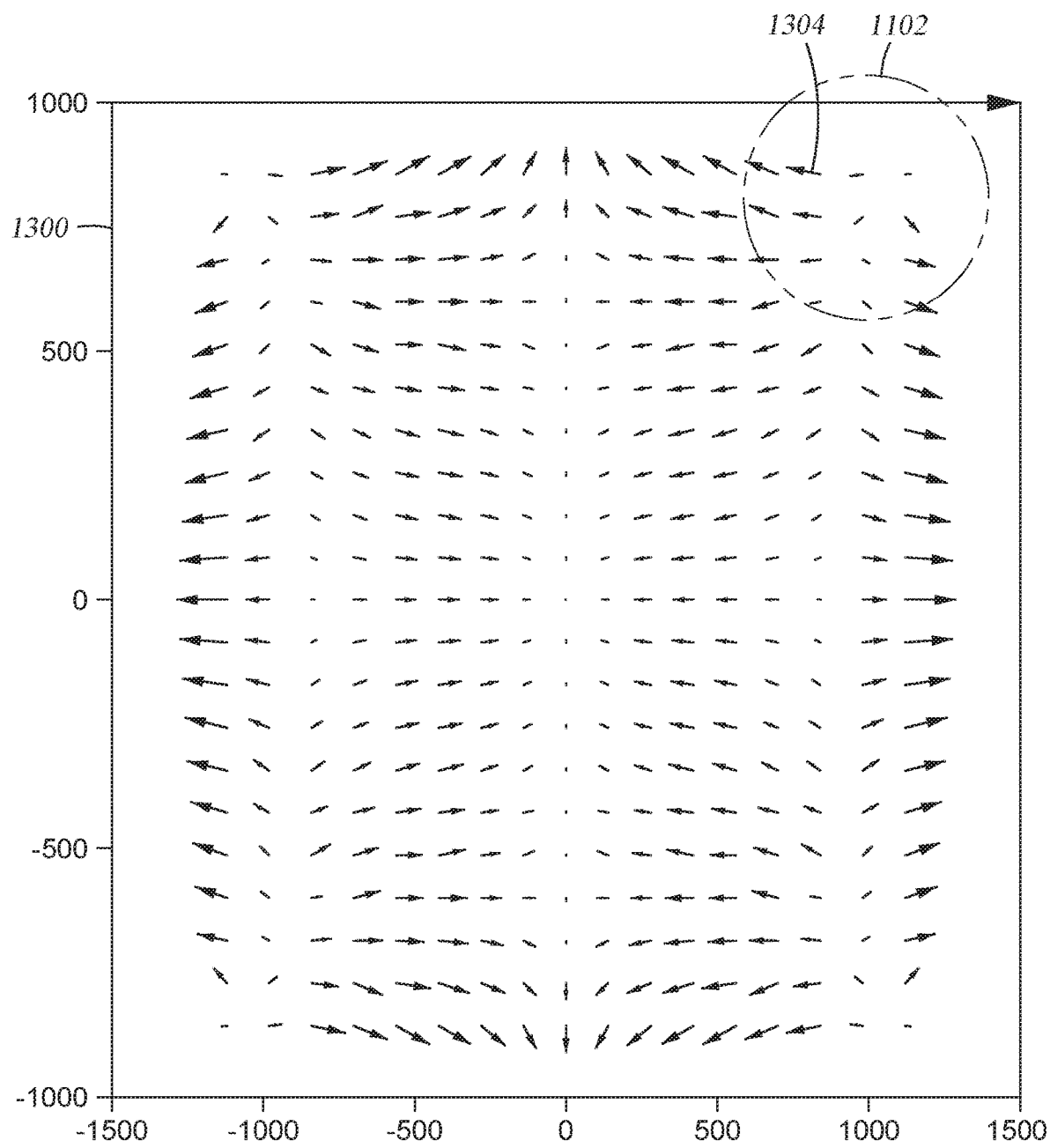
FIG. 13 depicts a vector representation of a reduction in distortion after correction for non-linear distortion has been applied to residual distortion shown in FIG. 12, in accordance with the embodiments disclosed herein.

In another embodiment, a linear correction can be applied to the distortion 1104 to reduce the amount of distortion in section 1102. "Linear distortion" can be some type of scaling error. Linear distortion can be corrected by using some type of scaling rotation and/or shift. For example, FIG. 12 shows a vector representation 1200 of a reduction in distortion 1204 down to about 45 microns in portion 1102 after correction of linear distortion has been applied to the distortion 1104 shown in FIG. 11. After correction of linear distortion has occurred a correction of non-linear can be applied to further reduce the amount of distortion. For example, FIG. 13 depicts a vector representation 1300 of a reduction in distortion 1304 (e.g., down to about 9e-14 microns) after correction for non-linear distortion has been applied to the distortion 1204 shown in FIG. 12.

Figure 11B:
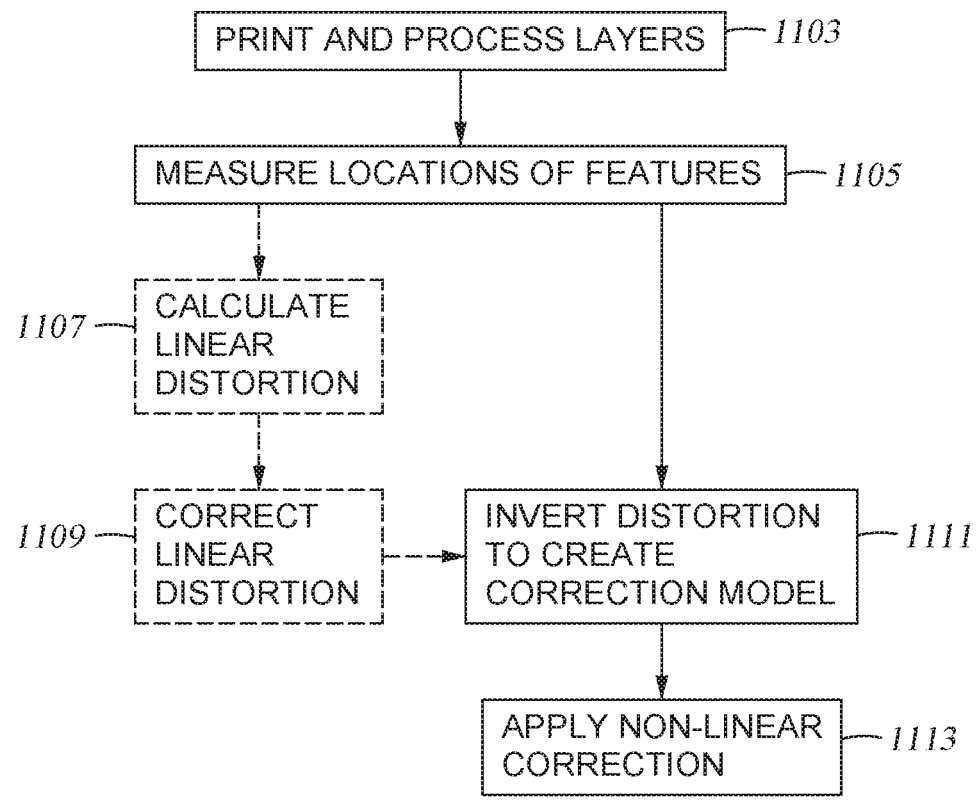
FIG. 11B depicts a method of correcting distortion in accordance with embodiments disclosed herein.

FIG. 11B depicts a method 1101 of correcting distortion in accordance with embodiments disclosed herein. At block 1103, two layers are printed and process (e.g., a first layer and a second layer). At block 1105, differences between the locations of features on the first layer and those same features on the second layer are measured. In an embodiment, after block 1105 the method 1101 proceeds towards optional block 1107. At block 1107, linear distortion (e.g., errors due to scaling, rotation and shift) is calculated using the measurements from step 1105. Thereafter, the method 1101 proceeds towards an optional block 1109. At block 1109, correction for the linear distortion is applied to the second layer. After correction for linear distortion is applied, the method proceeds towards block 1111. At block 1111, a distortion model(s) is created based upon the measurements at block 1105, the distortion model(s) is inverted to create a correction model(s) and the correction models are combined (when there are multiple sections and correction models). At block 1113, non-linear correction is applied to the distortion.

In another embodiment of method 1101, after block 1105 the method 1101 proceeds towards block 1111 to calculate non-linear distortion without having performed optional blocks 1107 and 1109. After block 1111, block 1113 is performed as described above.

Although Eq. (6)-(11) can be used to correct non-linear distortion in method 1101, other equations can be used. For example, that the distortion is section 1102 is some type of "pincushion" distortion an embodiment of a pincushion distortion model can be:

$$\hat{r}=r+\Delta r \qquad \text{Eq. (12)}$$

where $\hat{r}$ defines a new point on the substrate for a given distance, r, from the center of the substrate and $\Delta r$ is the difference between r and the printed location of that feature.

$$\Delta r(r) = K \frac{r^3}{r_{max}^3} \qquad \text{Eq. (13)}$$

where $\Delta r$ is the difference between r and the printed location of that feature, r is the distance from the center of the coordinate system and K is the maximum distortion. For example when K is 100 microns, the maximum distortion can be 100 microns.

Examples of scaling equations for correction of linear distortion, in block 1107, are provided by Eq. (14) and (15). For example, $$\Delta x(x,y)=\alpha_x x \qquad \text{Eq. (14)}$$

where Δx is the amount of distortion in x, $\alpha_x$ is a scaling of the x coefficient, and x is a position.

$$\Delta y(x,y) = \alpha_y y \qquad \text{Eq. (15)}$$

where Δy is the amount of distortion in y, $\alpha_y$ is a scaling of the y coefficient and y is a position.

Examples of other equations that can be used to correct non-linear distortion are provided by Eq. (16) and Eq. (17). For example, $$\Delta x(x, y) = \sum_{l}^{L} p_{xl} P_l(x, y) \qquad \text{Eq. (16)}$$

where Δx is the distortion in x for a given (x,y) position; l represents an index of the polynomial term; L represents the number of polynomial terms; and Pl(x,y) are polynomial terms provided by Eq. (6), (7), (8), (9), (10), and (11).

$$\Delta y(x, y) = \sum_{l}^{L} p_{yl} P_l(x, y) \qquad \text{Eq. (17)}$$

where Δy is the distortion in y for a given (x,y) position; l represents an index of the polynomial term; L represents the number of polynomial terms; and Pl(x,y) are polynomial terms provided by Eq. (6), (7), (8), (9), (10), and (11).

A calibration algorithm can be applied to determine model parameters $\alpha_x$, $\alpha_y$ as well as $p_{xl}$ and $p_{yl}$. An example of a calibration algorithm that can be used in accordance with the material disclosed herein is a Cholesky algorithm (also known as "Cholesky Decomposition").

Figure 14:
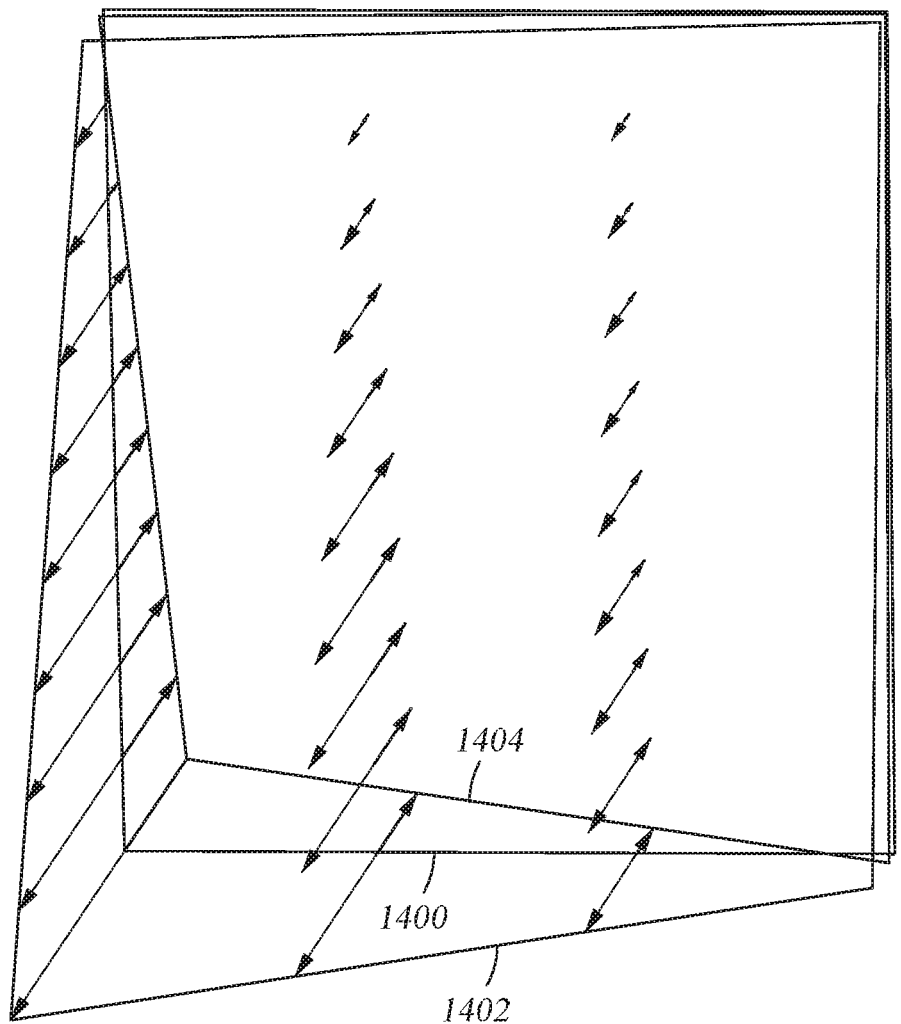
FIG. 14 depicts a substrate having a vector representation of an example distortion and a vector representation of correction for the distortion.
Figure 15:
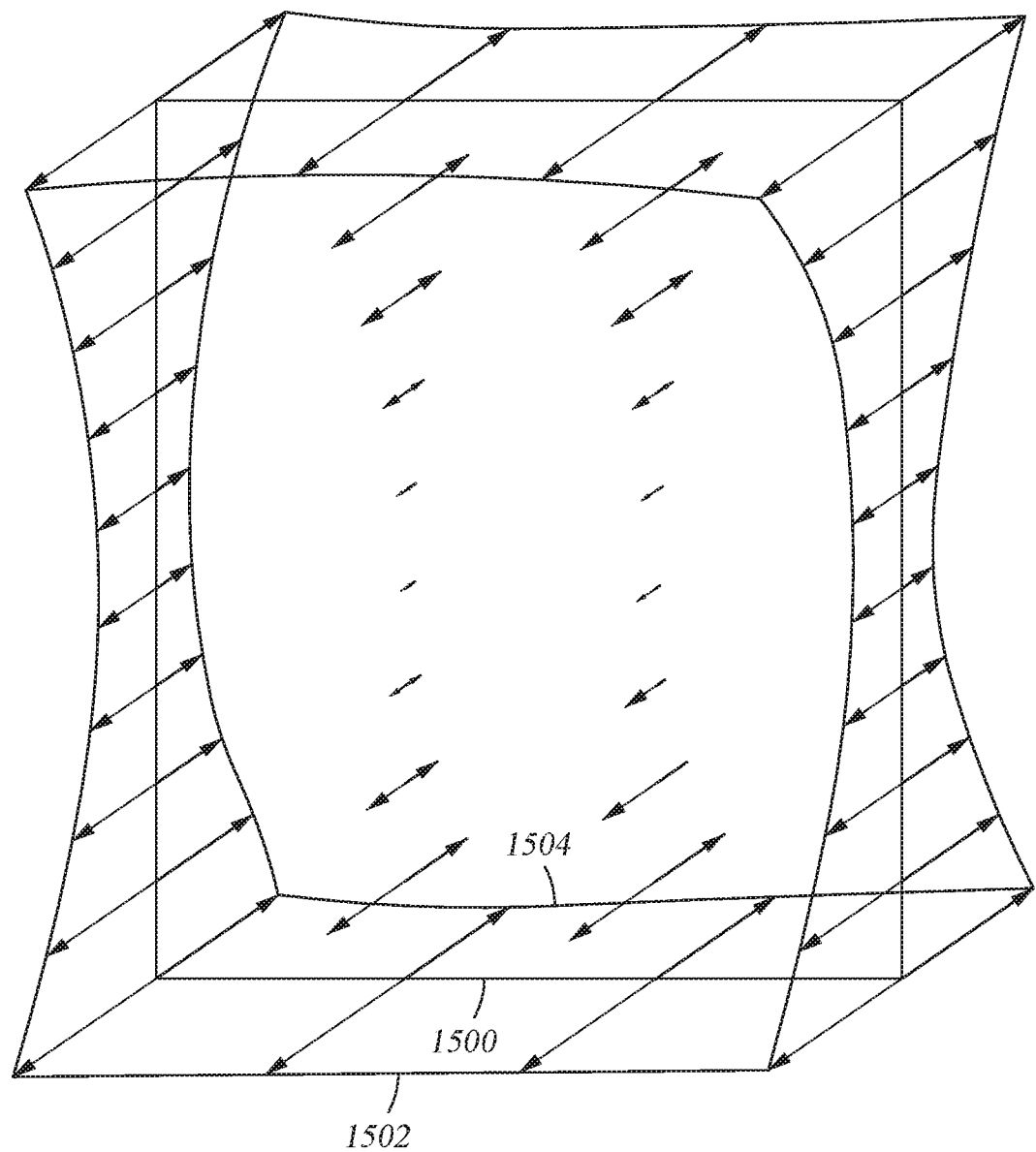
FIG. 15 depicts a substrate having a vector representation of an example distortion and a vector representation of correction for the distortion.
Figure 16:
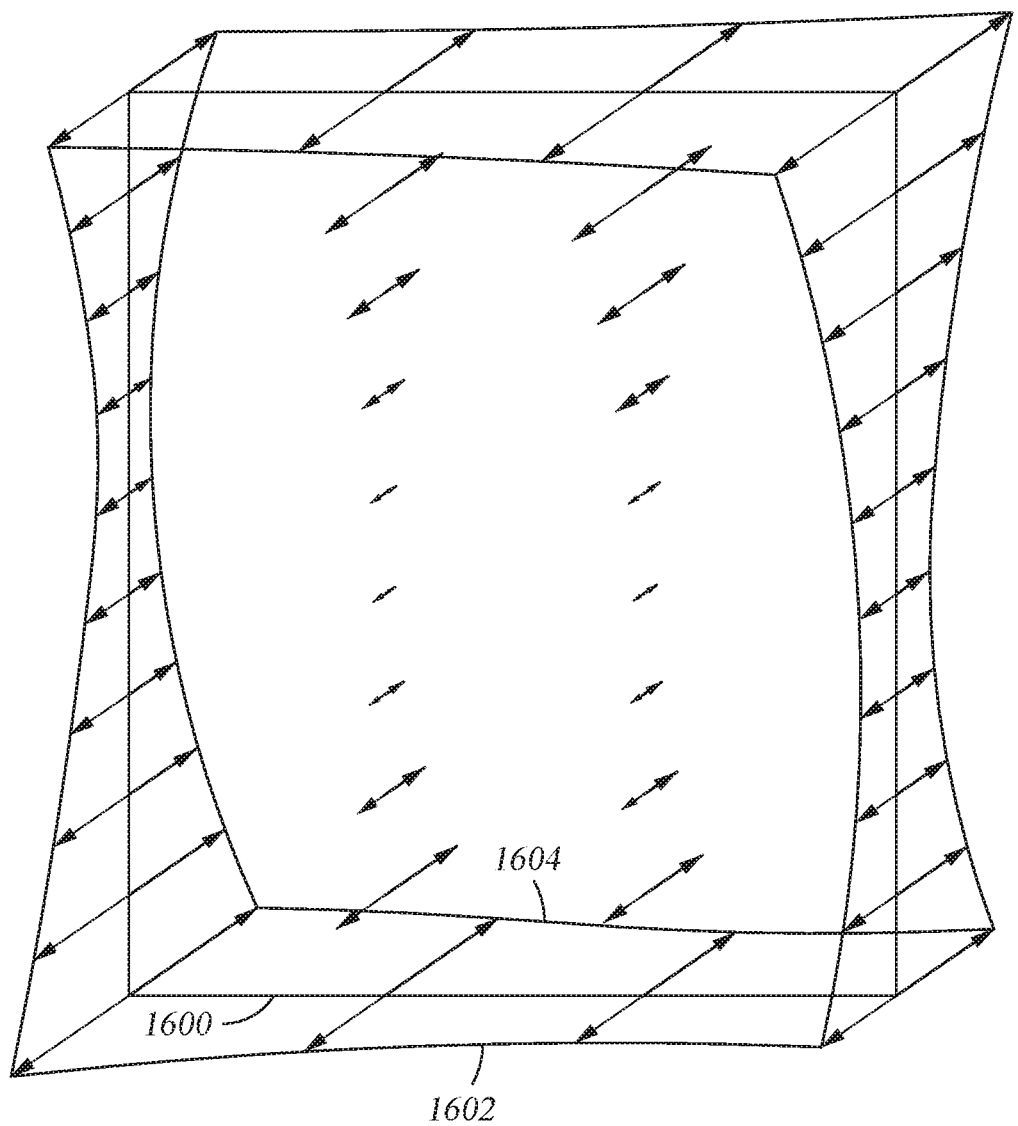
FIG. 16 depicts a substrate having a vector representation of an example distortion and a vector representation of correction for the distortion.

FIG. 14 depicts a vector representation of an example of nonlinear distortion 1404 to a substrate 1400 and a vector representation of correction 1402 for the distortion 1404. FIG. 15 depicts a vector representation of an example of nonlinear distortion 1504 to a substrate 1500 and a vector representation of correction 1502 for the distortion 1504. FIG. 16 depicts a vector representation of an example of nonlinear distortion 1604 to a substrate 1600 and a vector representation of correction 1602 for the distortion 1604.

As used herein, the terms "having," "containing," "including," "comprising" and the like are open ended terms that indicate the presence of stated elements or features, but do not preclude additional elements or features. The articles "a," "an," and "the" are intended to include the plural as well as the singular, unless the context clearly indicates otherwise.

While the foregoing is directed to embodiments in this disclosure, other and further embodiments may be devised without departing from the basic scope thereof, and the scope thereof is determined by the claims that follow.

We claim:

1. A method comprising:
   printing and processing a first layer on a substrate, wherein the first layer comprises a plurality of sections;
   measuring actual feature locations on the first layer, wherein the actual feature location corresponds to designed feature locations;
   creating a distortion model from the actual feature locations for each section of the first layer and from the designed feature locations for each section of the first layer, wherein each section comprises a plurality of actual feature locations;
   inverting the distortion model of each section of the first layer to create at least one correction model, wherein the at least one correction model comprises at least one non-linear correction to the distortion model; and
   printing and processing a second layer on top of the first layer using the at least one correction model.

2. The method of claim 1 wherein at least one distortion model is represented in polynomial form.

3. The method of claim 1 wherein the distortion model for each section is selected in response to differences between the actual feature locations and the designed feature locations.

4. The method of claim 1 further comprising:
   repeating,
      the printing,
      the measuring,
      the creating, and
      the inverting until a penultimate layer is printed and processed; and
   printing and processing a last layer using the at least one correction model created from actual feature locations on the penultimate layer and design feature locations for the penultimate layer.

5. The method of claim 1 further comprising:
   calculating linear distortion due to scaling, rotation and shift; and
   correcting linear distortion before creating a distortion model.

6. The method of claim 1 wherein the at least one correction model is based on an average distortion measured from multiple representative processes.

7. The method of claim 1 wherein the at least one correction model is created from an average of at least two distortion models.

8. The method of claim 1 further comprising:
   dividing, before measuring, the substrate, into sections.

9. The method of claim 8 wherein a distortion model in one section is different than a distortion model in another subsection.

10. The method of claim 8 wherein each correction model in the at least one correction model is combined to create a global correction model.

11. The method of claim 8 wherein a low pass filter is applied to adjoining borders of the sections.

12. The method of claim 11 wherein the low pass filter is a Gaussian Filter.

13. The method of claim 8 wherein the actual feature locations are a plurality of actual feature locations and the designed feature locations are a plurality of designed feature locations in at least one of the sections.

14. The method of claim 13 wherein there are at least four of the actual feature locations and at least four of the designed feature locations in the at least one of the sections.

15. A method comprising:
   printing and processing a first layer on a first substrate;
   aligning, for plate shift and rotation, a second layer with the first layer;
   printing and processing the aligned second layer on top of the first layer; and
   measuring separation between printed features on the first layer and printed features on the aligned second layer.

16. The method of claim 15 wherein the aligned second layer is each individual layer after the first layer,
   aligning, for plate shift and rotation, each second layer with the first layer;
   printing and processing each second layer; and measuring separation between each second layer and the first layer.

17. The method of claim 15 further comprising:
reprinting the first layer and a corrected second layer using the measured separation between the first layer and the second layer, wherein the reprinting is on a second substrate different from the first substrate;
aligning, for plate shift and rotation, a third layer with the second layer;
printing and processing the aligned third layer; and
measuring separation between the aligned third layer and the second layer.

18. The method of claim 17 further comprising:
reprinting the first layer, the corrected second layer and a corrected third layer using the measured separation between the second layer and the third layer wherein the reprinting is on a third substrate different from the first and second substrates.

19. A method comprising:
printing and processing a first layer on a substrate;
aligning, for plate shift and rotation, a second layer with the first layer;
printing and processing the aligned second layer on the substrate;
measuring separation between printed features on the first layer and printed features on the second layer;
aligning, for plate shift and rotation, a third layer with the first layer;
printing and processing the aligned third layer on the substrate; and
measuring separation between printed features on the third layer and the printed features on the first layer.

20. The method of claim 19 further comprising at least one intermediate layer between the first layer and the third layer, wherein
each respective layer in the at least one intermediate layer has been:
aligned, for plate shift and rotation, with the first layer,
printed and processed on the substrate, and
measured for separation with the first layer.

* * * * *

UNITED STATES PATENT AND TRADEMARK OFFICE
CERTIFICATE OF CORRECTION

PATENT NO.         : 10,935,892 B2
APPLICATION NO.    : 15/595497
DATED              : March 2, 2021
INVENTOR(S)        : Tamer Coskun et al.

Page 1 of 1

It is certified that error appears in the above-identified patent and that said Letters Patent is hereby corrected as shown below:

In the Specification

In Column 6, Line 6, delete "$\Delta y(x,y)=f(x,y)$" and insert --$\Delta x(x,y)=f(x,y)$--, therefor.

Signed and Sealed this
First Day of June, 2021

Drew Hirshfeld
*Performing the Functions and Duties of the*
*Under Secretary of Commerce for Intellectual Property and*
*Director of the United States Patent and Trademark Office*